US008674507B2

(12) United States Patent
Chou et al.

(10) Patent No.: US 8,674,507 B2
(45) Date of Patent: Mar. 18, 2014

(54) WAFER LEVEL PROCESSING METHOD AND STRUCTURE TO MANUFACTURE TWO KINDS OF INTERCONNECTS, GOLD AND SOLDER, ON ONE WAFER

(75) Inventors: Chien-Kang Chou, Shin Hwa Town (TW); Chiu-Ming Chou, Kao-Hsiung (TW); Li-Ren Lin, Bali Township, Taipei Country (TW); Chu-Fu Lin, Kaohsiung (TW)

(73) Assignee: Megit Acquisition Corp., San Diego, CA (US)

( * ) Notice: Subject to any disclaimer, the term of this patent is extended or adjusted under 35 U.S.C. 154(b) by 646 days.

(21) Appl. No.: 10/855,086

(22) Filed: May 27, 2004

(65) Prior Publication Data

US 2005/0017355 A1    Jan. 27, 2005

(30) Foreign Application Priority Data

May 27, 2003    (TW) ................ 92114226 A (51) Int. Cl.
 *H01L 23/48* (2006.01)
(52) U.S. Cl.
 USPC .................. 257/748; 257/E23.021
(58) Field of Classification Search
 USPC ......... 257/737, 738, 741, 772, 734, 748, 750, 257/E21.508, E23.02, E23.021
 See application file for complete search history.

(56) References Cited

U.S. PATENT DOCUMENTS

| | | | |
|---|---|---|---|
| 4,463,059 A | 7/1984 | Bhattacharya et al. | |
| 4,624,749 A * | 11/1986 | Black et al. | ..................... 205/50 |
| 5,226,232 A | 7/1993 | Boyd | |
| 5,532,612 A | 7/1996 | Liang | ............................. 324/760 |
| 5,631,499 A | 5/1997 | Hosomi et al. | |
| 5,641,990 A | 6/1997 | Chiu | |
| 5,665,639 A | 9/1997 | Seppala et al. | .................. 438/15 |
| 5,742,094 A * | 4/1998 | Ting | ............................. 257/620 |
| 5,883,435 A | 3/1999 | Geffken et al. | |
| 6,013,571 A | 1/2000 | Morrell | |
| 6,077,726 A | 6/2000 | Mistry et al. | |
| 6,144,100 A | 11/2000 | Shen et al. | |
| 6,187,680 B1 | 2/2001 | Costrini et al. | |
| 6,228,689 B1 | 5/2001 | Liu | ............................. 438/131 |
| 6,229,711 B1 | 5/2001 | Yoneda | |
| 6,383,916 B1 | 5/2002 | Lin | ............................. 438/637 |

(Continued)

FOREIGN PATENT DOCUMENTS

| | | |
|---|---|---|
| EP | 1387402 | 2/2004 |
| EP | 1536469 | 6/2005 |
| TW | 452949 | 9/2001 |
| TW | 471148 | 1/2002 |

OTHER PUBLICATIONS

Venkatesan, S. et al. "A High Performance 1.8V, 0.20 pm CMOS Technology with Copper Metallization," Technical Digest IEEE International Electron Devices Meeting (1997) pp. 769-772.

(Continued)

*Primary Examiner* — Colleen Matthews
(74) *Attorney, Agent, or Firm* — Seyfarth Shaw LLP (57) ABSTRACT

A chip structure comprising a substrate, a plurality of wire bonding pads and a plurality of solder pads is provided. Gold bumps or gold pads can be formed on the wire bonding pads while solder bumps can be formed on the solder pads concurrently. Alternatively, both wire bonding pads and solder pads can be formed of the same metal stack.

42 Claims, 10 Drawing Sheets

(56) References Cited

U.S. PATENT DOCUMENTS

| | | | |
|---|---|---|---|
| 6,426,281 B1 | 7/2002 | Lin et al. | |
| 6,432,748 B1 | 8/2002 | Hsu | |
| 6,479,900 B1 | 11/2002 | Shinogi et al. | |
| 6,492,692 B1 | 12/2002 | Ishii et al. | 257/408 |
| 6,511,901 B1 | 1/2003 | Lam et al. | |
| 6,683,380 B2 | 1/2004 | Efland et al. | |
| 6,692,629 B1 | 2/2004 | Chen et al. | |
| 6,707,159 B1 | 3/2004 | Kumamoto et al. | |
| 6,762,122 B2 | 7/2004 | Mis et al. | |
| 6,762,503 B2 * | 7/2004 | Lee | 257/781 |
| 6,809,020 B2 | 10/2004 | Sakurai et al. | |
| 6,853,076 B2 | 2/2005 | Datta et al. | |
| 6,940,169 B2 | 9/2005 | Jin et al. | |
| 7,220,657 B2 | 5/2007 | Ihara et al. | |
| 2001/0040290 A1 | 11/2001 | Sakurai et al. | |
| 2002/0043723 A1 | 4/2002 | Shimizu et al. | |
| 2003/0006062 A1 | 1/2003 | Stone et al. | |
| 2003/0057559 A1 * | 3/2003 | Mis et al. | 257/762 |
| 2003/0218246 A1 | 11/2003 | Abe et al. | |
| 2004/0007779 A1 | 1/2004 | Arbuthnot et al. | |
| 2005/0121804 A1 | 6/2005 | Kuo et al. | |

OTHER PUBLICATIONS

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. "Post Passivation Technology™—MEGIC® Way to System Solutions," Presentation given at TSMC Technology Symposium, Japan (Oct. 1, 2003) pp. 1-32.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with.Copper Metallization," Technical Digest IEEE International Electron Devices Meeting (1997) pp. 769-772

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50

Maloney, T. et al. "Stacked PMOS Clamps for High Voltage Power Supply Protection," Electrical Overstress/Electrostatic Discharge Symposium Proceedings (1999) pp. 70-77

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

FIG. 23 ated May 27, 2003.

WAFER LEVEL PROCESSING METHOD AND STRUCTURE TO MANUFACTURE TWO KINDS OF INTERCONNECTS, GOLD AND SOLDER, ON ONE WAFER

This application claims priority to Taiwan Application No. 092114226, filed May 27, 2003.

BACKGROUND OF THE INVENTION (1) Field of the Invention

The invention relates to the manufacturing of high performance Integrated Circuit (IC's), and, more specifically, to a wafer structure and fabrication method to form both gold and solder bumps on the same wafer.

(2) Description of the Related Art

Integrated circuit (IC) packaging techniques must be able to accommodate the developing trends of electronic devices, including digitization, networking, localization, and user friendliness. In order to meet these requirements, electronic devices must be functional, highly integrated, miniaturized, lightweight, inexpensive, and high speed. There is a soaring demand for incorporating many more functions on one chip while still having few bonding pads to link the chip to other substrates. High-density IC packages such as ball grid arrays (BGA), chip scale packages (CSP), flip chips, and multi-chip modules (MCM) have been developed. For high-density IC packaging, the speed of signal transmission increases as the wiring length decreases. Thus, the application of bumps has become a major trend in high-density packaging.

Having solder bonding and wirebonding capabilities simultaneously on a same wafer is desirable for applications of chip-on-chip or chip-on-silicon-substrate assembly. Currently, solder bonding is provided by creating solder bumps on a subset of the bonding pads, while wirebonding is performed on the remainder of the original bonding pads; that is, on the aluminum surface. However, the process of creating solder bumps on the wafer will often damage the aluminum bonding pads, making it impossible to perform wirebonding on the original aluminum bonding pads.

In our invention, we create gold bumps or gold pads to protect the aluminum pads before performing the solder bumping process. The gold bumps or gold pads can be used for the wirebonding or TAB (Tape-Automated-Bonding). Having both solder bumps and gold bumps placed on one wafer enables the possibility of chip-on-chip or chip-on-silicon-substrate packages. A process to form both solder bumps and gold bumps on the same wafer will allow a large chip to be solder bonded face-to-face with one or several smaller chips and later wirebonded or TAB (Tape-Automated-Bonding) to the next layer of an assembly (for example, organic, ceramic or glass substrate).

U.S. Pat. No. 6,492,692 to Ishii et al describes solder and gold bumps together, but gives no details about how these two types of bumps are to be formed on a same wafer. A barrier metal layer of TiW and Au is disclosed for gold bumps. U.S. Pat. No. 6,228,689 (Liu), U.S. Pat. No. 5,655,639 (Seppala et al), and U.S. Pat. No. 5,532,612 (Liang) teach diffusion/barrier layers of TiW and Au under gold bumps. The last patent teaches that formation of solder and gold bumps differs in many details. U.S. Pat. No. 6,383,916 to Lin et al, assigned to the same assignee as the present invention, adds, in a post passivation processing sequence, a thick layer of dielectric over a layer of passivation and layers of wide and thick metal lines on top of the thick layer of dielectric.

SUMMARY OF THE INVENTION

It is the primary objective of the invention to provide a chip structure and a manufacturing method thereof wherein a wire bonding (or TAB bonding) pad and a solder pad are concurrently fabricated on a same wafer.

Another objective of the invention is to provide a wafer structure having both a wire (or TAB) bonding pad and a solder pad thereon.

Yet another objective of the invention is to provide a connection structure of a chip and an external circuit wherein a bonding wire (or TAB lead) connects a wire (or a TAB) bonding pad to a circuit board or next level of assembly and a solder bump connects a solder pad on the same chip to other chips.

A further objective of the invention is to provide a chip structure having a post-passivation interconnection scheme wherein wire (or TAB) bonding pads are formed of the same material as the post-passivation interconnection lines.

A still further objective of the invention to provide a method of fabricating both wire (or TAB) bonding pads and solder pads on a same wafer.

According to the objectives of the invention, a chip structure having both wire (or TAB) bonding pads and solder pads thereon is achieved. The chip structure comprises a substrate comprising a plurality of bonding pads and a passivation layer overlying the bonding pads wherein the passivation layer comprises a plurality of openings through which are exposed the bonding pads. A plurality of wire bonding (or TAB) pads comprising gold are disposed on a first subset of the plurality of bonding pads exposed through the openings and a plurality of solder pads are disposed on a second subset of the plurality of bonding pads not covered by the wire (or TAB) bonding pads.

Also according to the objectives of the invention, a connection between a chip structure and an external circuit are achieved. The chip structure comprises a substrate comprising a plurality of bonding pads and a passivation layer overlying the bonding pads wherein the passivation layer comprises a plurality of openings through which the bonding pads are exposed. A plurality of wire (or TAB) bonding pads comprising gold are disposed on a first subset of the plurality of bonding pads exposed through the openings. A plurality of bond wires (or TAB leads) electrically connect between the wire (or TAB) bonding pads and the external circuit. A plurality of solder pads are disposed on a second subset of the plurality of bonding pads not covered by the wire (or TAB) bonding pads. A plurality of solders are disposed on the solder pads to electrically connect to the external circuit.

Also in accordance with the objectives of the invention, a fabrication process for forming a chip structure having wire (or TAB) bonding pads and solder pads on the same wafer is achieved. A substrate is provided comprising a plurality of bonding pads and a passivation layer overlying the bonding pads wherein the passivation layer comprises a plurality of openings through which the bonding pads are exposed. A plurality of wire (or TAB) bonding pads are formed, disposed on a first subset of the plurality of bonding pads exposed through the openings. A plurality of solder pads are formed, disposed on a second subset of the plurality of bonding pads not covered by the wire (or TAB) bonding pads. Then, the substrate is diced to form a plurality of chips.

DESCRIPTION OF THE PREFERRED EMBODIMENTS

Figure 1:
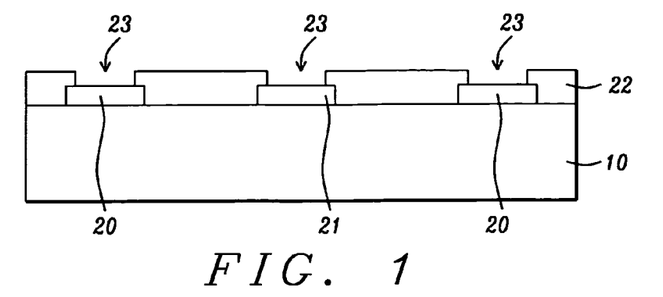
FIGS. 1 through 11 are a cross-sectional representations of a first preferred embodiment of the present invention.

Referring now more specifically to FIG. 1, there is shown a cross section of a partially completed integrated circuit device. The wafer 10 includes a semiconductor substrate and semiconductor device structures not shown, formed in and on the substrate. For example, gate electrodes and associated source and drain regions and multiple levels of interconnecting lines may be fabricated on the wafer 10.

A plurality of bonding pads 20 and 21 are provided in a top layer on the wafer as shown. The bonding pads can be made of copper, aluminum, an aluminum alloy, and so on, and have a thickness from about 0.1 to 3 microns. The bonding pads can be used for inputting/outputting of signal and power sources and for interconnection to other devices in a package.

A passivation layer 22, formed of, for example, a single or a composite layer of silicon oxide, silicon nitride, and silicon oxynitride, is provided over the surface of the wafer and over the bonding pads 20 and 21 and functions to prevent the penetration of mobile ions (such as sodium ions), moisture, transition metal (such as gold, copper, silver), and other contamination. The passivation layer is used to protect the underlying devices and metal interconnecting lines. A plurality of openings 23 in the passivation layer expose the surface of the bonding pads 20 and 21.

Figure 2:
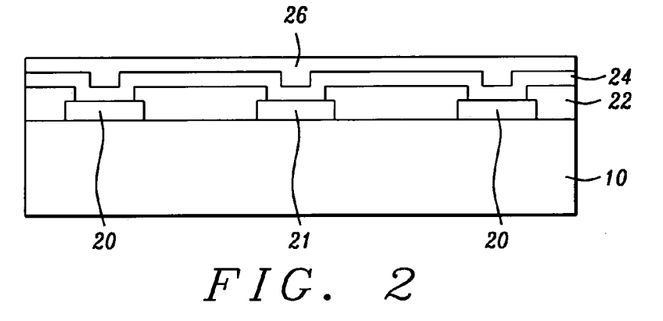

Referring now to FIG. 2, an adhesion layer 24 and a seed layer 26 are deposited over the passivation layer 22 and over the bonding pads 20 and 21 exposed by the openings 23 in the passivation layer 22. The adhesion layer 24 will also act as a diffusion/barrier layer for the wire bonding bumps. The adhesion/barrier layer 24 is preferably titanium tungsten (TiW) sputter deposited globally on the passivation layer 22 to a thickness of between about 500 and 8000 Angstroms. Other possible materials include tantalum, tantalum nitride, and titanium nitride. The seed layer 26 is preferably gold sputter deposited to a thickness of between about 300 and 3000 Angstroms over the adhesion layer 24. Other seed layer materials include copper.

Figure 3:
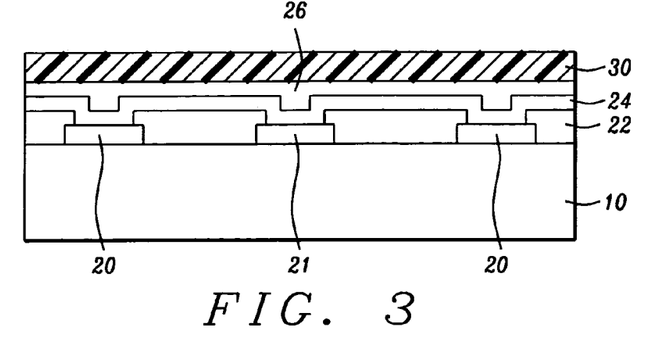
Figure 4:
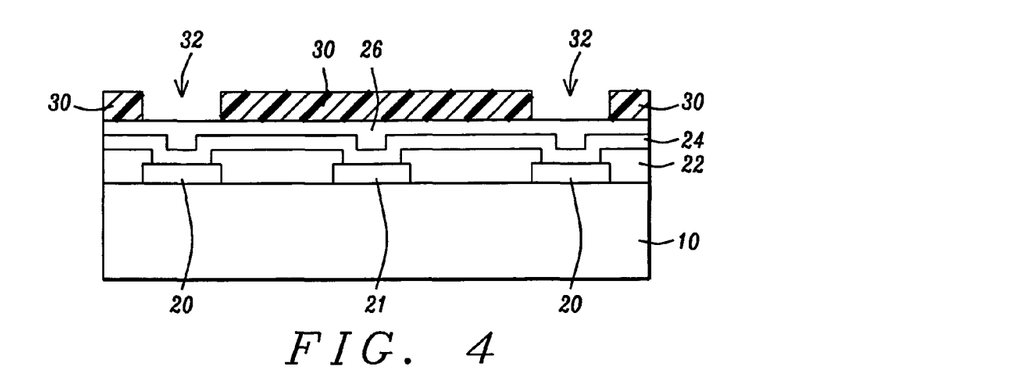

Now, a mask layer 30 is formed over the seed layer 26, as shown in FIG. 3. For example, the mask layer 30 may be a photoresist layer. Now, as shown in FIG. 4, openings 32 are made in the mask layer 30 to expose the seed layer 26 over certain of the bonding pads 20, the mask layer 30 covering the seed layer 26 over other bonding pads 21. For example, the photoresist layer 30 is exposed to UV light and developed away to leave openings 32 over those bonding pads 20 to which wire (or TAB) bonding pads are to be connected.

Figure 5:
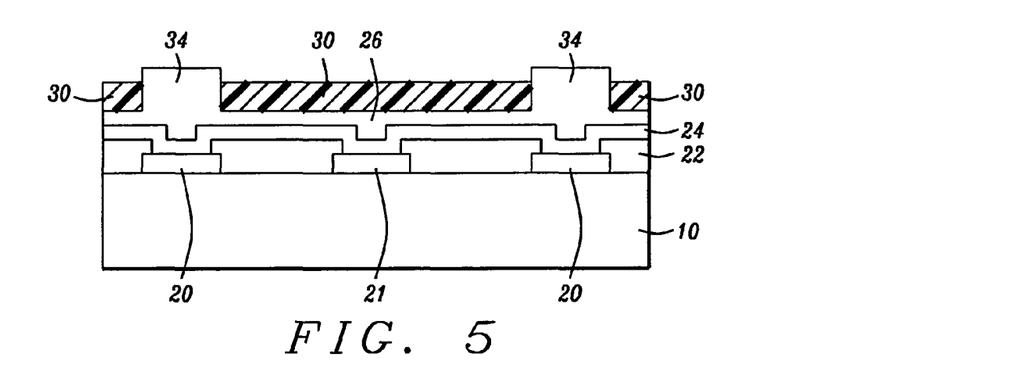

Referring now to FIG. 5, gold caps 34 are formed by, for example, electroplating. The gold caps 34 comprise the seed layer 26 and the thicker electroplated layer overlying the seed layer. The thickness of the gold caps 34 can vary upon demand. For example, a typical gold bump 34 is between about 1 micron and 60 microns high. A most frequently used thickness is between about 2 and 5 microns.

Figure 6:
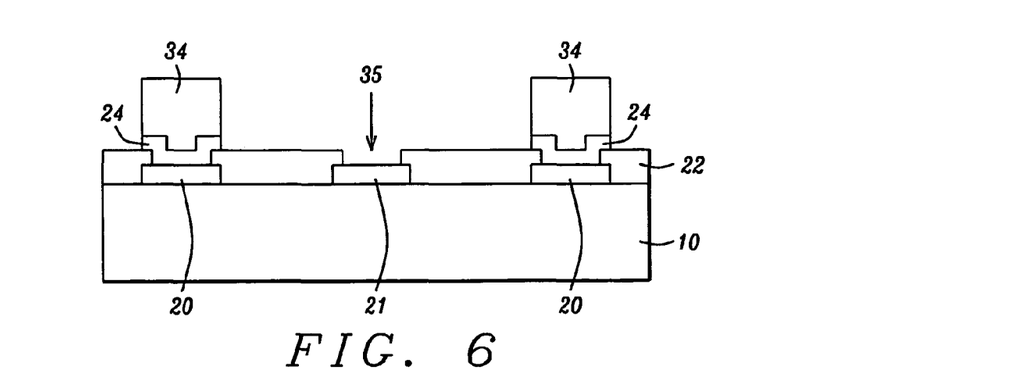

Referring now to FIG. 6, the mask layer 30 is removed. A further etching removes the seed layer 26 and the adhesion layer 24 not covered by the gold bumps 34. An $H_2O_2$-containing liquid may be used to remove the adhesion layer 24. The gold bumps 34 and underlying adhesion layer 24 form the wire (or TAB) bonding pads of the present invention formed on certain bonding pads 20. After this etching, other bonding pads 21 not covered by the formed wire (or TAB) bonding pads or bumps 34/24 are exposed through openings 35 in the passivation layer 22.

Figure 7:
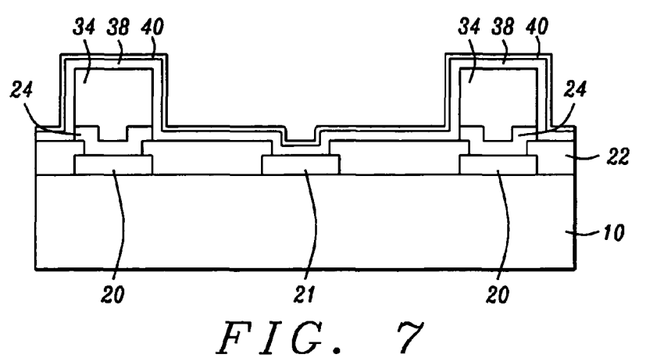

Now, a second adhesion layer 38 is formed over the surface of the wafer as shown in FIG. 7. The adhesion layer 38 may be titanium, chromium, a chromium-copper alloy, a titanium-copper alloy, or a titanium tungsten alloy, or combinations of the above, deposited to a thickness of between about 200 and 5000 Angstroms. A second seed layer 40 is deposited over the adhesion layer 38. The seed layer 40 may be copper, deposited to a thickness of between about 300 and 10,000 Angstroms. The adhesion layer 38 and seed layer 40 cover both the exposed bonding pads 21 and the formed wire (or TAB) bonding pads or bumps 34.

Figure 8:
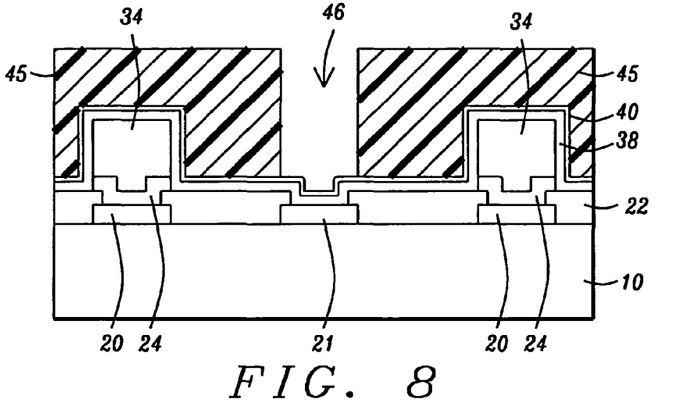

Now, a mask layer 45 is formed over the wafer having openings 46 to expose the seed layer 40 over the bonding pads 21 that are not covered by wire (or TAB) bonding pads 34/24, as shown in FIG. 8.

Figure 9:
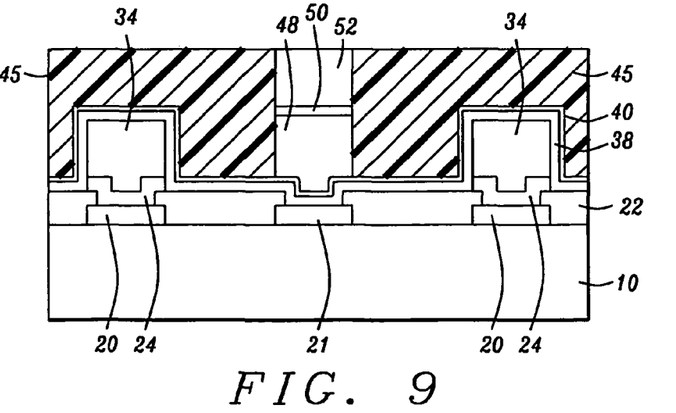

Now, solder bumps are to be formed as illustrated in FIG. 9. An under bump metal (UBM) or diffusion barrier layer 48 is formed within the openings 46. Preferably, the UBM layer 48 is formed by electroplating copper, tin, or nickel or a composite layer, such as nickel/copper, copper/nickel, tin/copper, copper/tin, titanium/copper, chromium/copper, chromium-copper/copper alloy, titanium/copper/nickel, chromium/copper/nickel, chromium-copper alloy/copper/nickel, and so on. The operational thickness of the UBM layer is about 15 microns.

Furthermore, a solder wettable layer 50 may be formed on the UBM layer 48 to increase bonding ability between the subsequently formed solder and the UBM layer 48. For example, the solder wettable layer 50 comprises gold, copper, tin, a tin-lead alloy, or an unleaded solder. The solder wettable layer 50 may have a thickness of between about 500 and 10,000 Angstroms.

Now, solder 52 is formed on the solder wettable layer 50. The solder 52 may be tin, a tin-lead alloy, a tin-silver alloy, or a tin-silver-copper alloy, or any other unleaded solder material.

Figure 10:
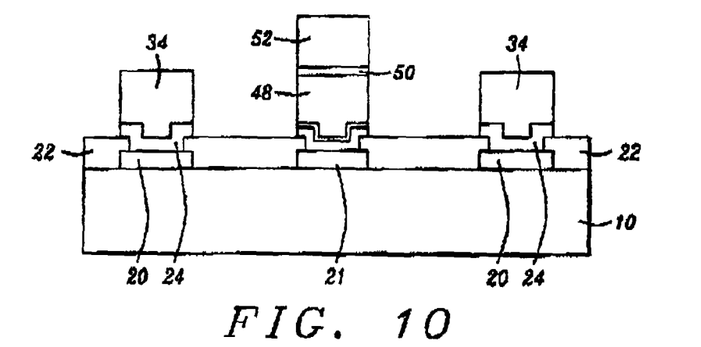

For example, solder 52 can be electroplated into the openings 46. Alternatively, in a printing method, a solder paste is pushed into the openings 46. Referring to FIG. 10, the mask layer 45 is removed. Furthermore, the adhesion layer 38 and seed layer 40 are removed where they are not covered by the solder 52. A BOE etchant may be used to remove the adhesion and seed layers 38 and 40. The adhesion/barrier layer 24 underlying the gold bumps 34 is resistant to the BOE etchant. Therefore, the etching process does not damage the underlying bonding pads 20.

Figure 11:
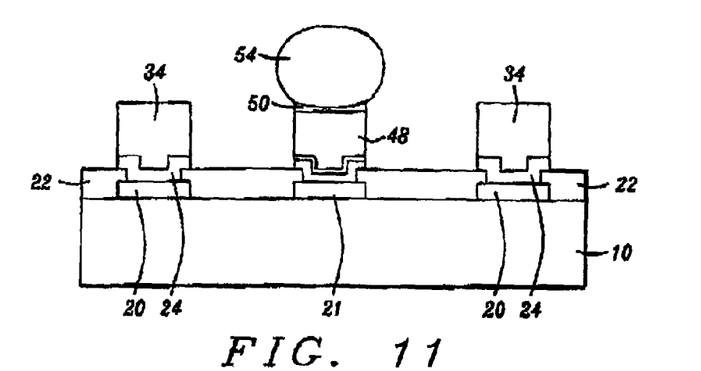

The solder 52 is reflowed to form the solder bump 54 shown in FIG. 11. It will be understood by those skilled in the art that the solder reflowing step may be performed prior to the removal of the adhesion and seed layers 38 and 40. The solder bump 54 has a thickness of between about 1 micron and 400 microns.

After completion of wafer fabrication, the wafer can be diced into a plurality of chips. After dicing, a chip typically includes a substrate comprising a plurality of electronic devices, covered by a passivation layer. Connections to external circuitry positioned over another substrate are made after dicing. The connection to external circuits are achieved through wire bonding or TAB bonding on the gold bumps, and through solder bonding on the solder bumps.

Figure 24:
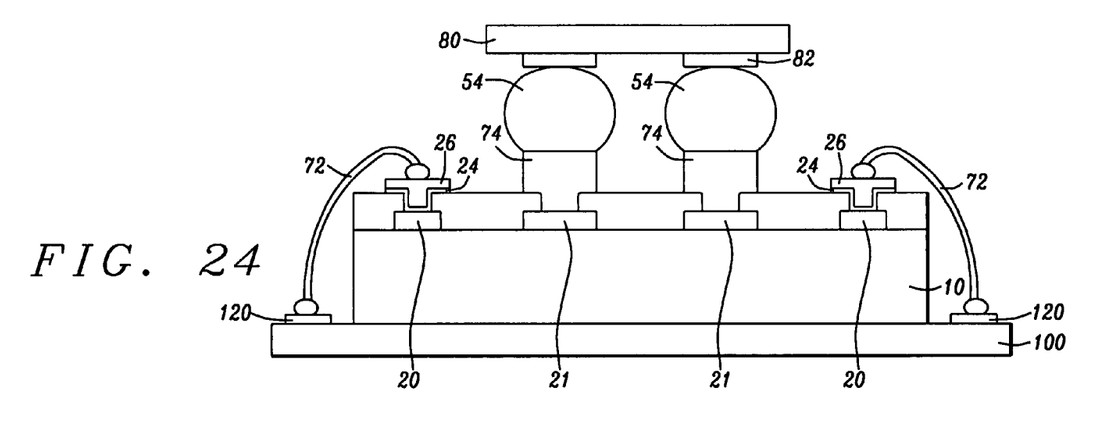
FIGS. 24 and 25 are cross-sectional representations of a chip of the present invention showing connections to other chips and substrates.
Figure 25:
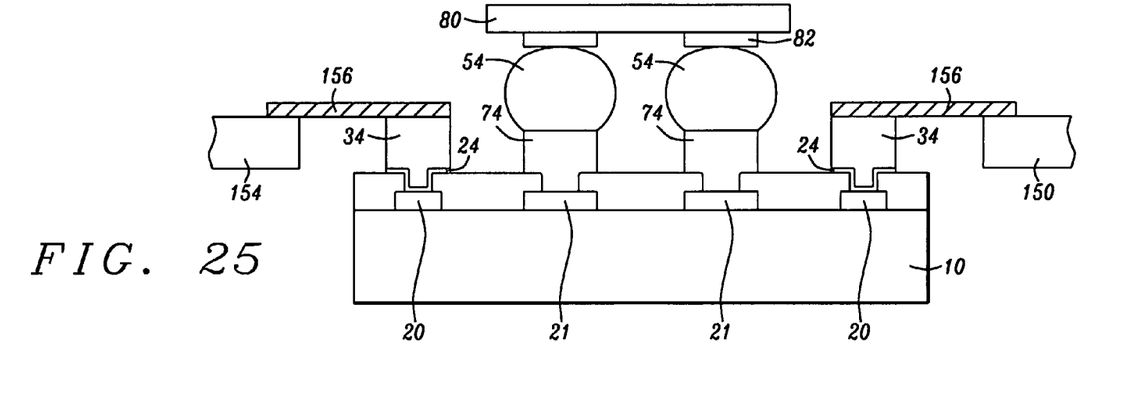

For example, refer to FIGS. 24 and 25 showing connections. FIGS. 24 and 25 show a chip-on-chip connection using solder bonding. Chip 10 is bonded to chip 80 using solder balls 54. Solder pads 82 have been formed on chip 80. In FIG. 24, wire bonds 72 are formed on gold pads 26 or on gold bumps 34 shown in FIG. 25 to connect to pads 120 on an external circuit 100. For example, circuit board 100 is connected to chip 10 through wire bonds 72 to pads 120. In FIG. 25, connection is made to flexible substrates 150 and 154 through TAB leads 156. TAB leads 156 are formed on gold bumps 34 or gold pads 26 shown in FIG. 24 on TAB bonding pads 20.

Figure 12:
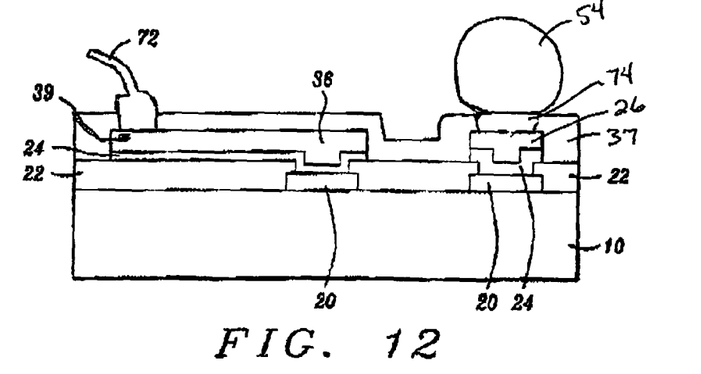
FIG. 12 is a cross-sectional representation of a completed chip structure showing a redistribution layer.

In another aspect of the invention, a redistribution layer may be formed on the wafer. With the redistribution layer, the original positions of the bonding pads can be redistributed to specific positions. The redistribution layer may be formed of the same material as the gold bumps and may be formed by the same process, as shown in FIG. 12. Redistribution layer 36 is shown. A cap layer 37 is on the redistribution layer 36, and an opening in the cap layer 37 exposes the gold pad 26. Area 39 represents a redistributed bond pad. For example, the circuit is connected to an external device, integrated circuit, or circuit board through a wire bond 72 directly on the redistribution layer 36. Alternatively, the wire bond 72 may be substituted for a solder bump formed on redistributed bond pad area 39. In this case, a UBM layer underlies the solder bump. Typically, the UBM layer may include an adhesion layer, a seed layer, a barrier/diffusion layer, and a solder wettable layer at its top surface. Also shown in FIG. 12 is a solder bump 54 formed on a gold pad 26. A UBM layer 74 is formed on the gold pad and the solder bump 54 is formed on the UBM layer.

Figure 13A:
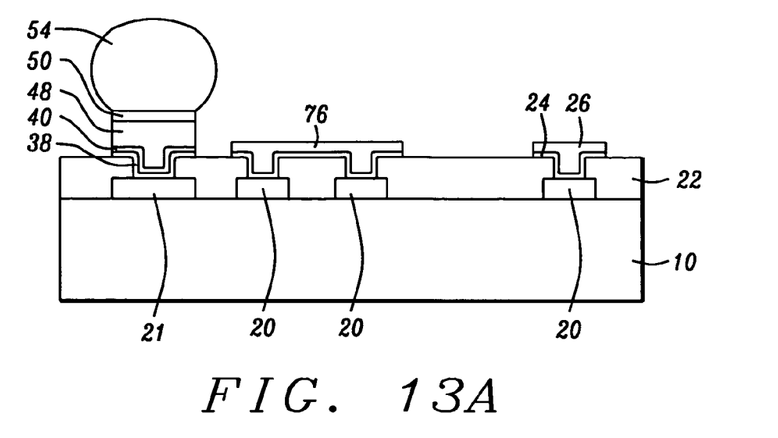
FIGS. 13A and 13B are cross-sectional representations of a completed chip structure showing a post-passivation metal interconnect structure.
Figure 13B:
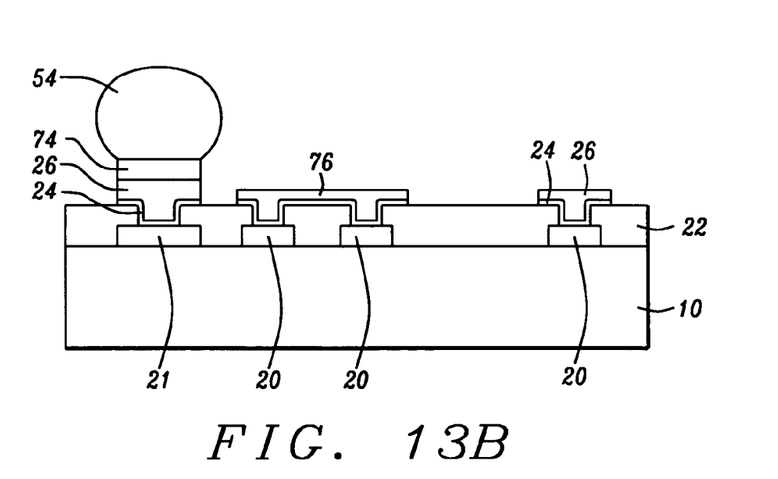

In another aspect of the invention, a post-passivation metal interconnect structure can be fabricated on the passivation layer, as shown in FIGS. 13A and 13B.

The post-passivation layer metal interconnect structure 76 connects one circuit to another circuit under the passivation layer 22 through openings in the passivation layer 22, as shown. For example, the post passivation layer metal interconnect structure 76 and the gold pads 26 are formed of the same type of material and may be formed by the same process. The openings in the passivation layer 22 can be, for example, greater than 0.1 micron in width. In FIG. 13A, solder bump 54 is formed on solder bonding pad 38/40/48/50, as described above. In FIG. 13B, solder bump 54 is formed on gold pad 26. UBM layer 74 is formed on the gold pad 76, then the solder bump 54 is formed.

The post passivation metal interconnect structure 76 may be a circuit that includes power bus, signal bus, and ground bus connected to power lines, signal lines, and ground lines under the passivation layer 22 through the openings in the passivation layer 22.

Active devices, passive devices, and/or metal interconnects may underlie the bonding pads connected to the gold bumps or gold pads.

Figure 14:
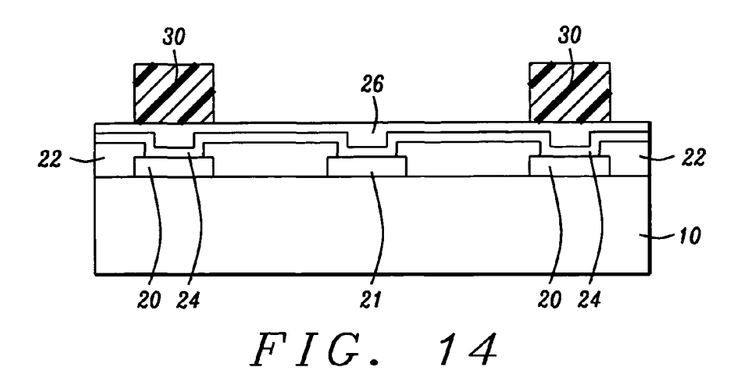
FIGS. 14 through 16 are cross-sectional representations showing a first alternative in the preferred embodiment of the present invention.
Figure 15:
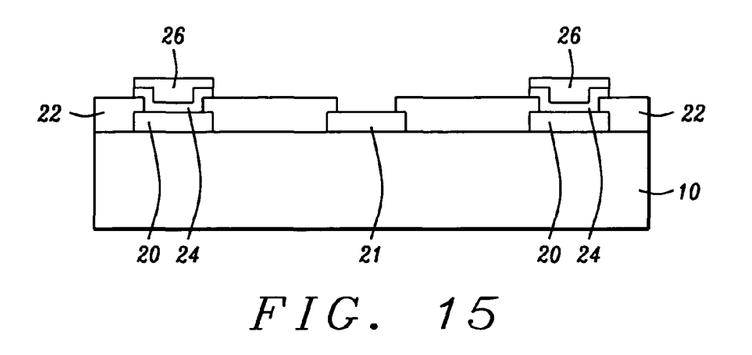

In an alternative to the method of the present invention, gold bonding pads will be formed instead of gold bumps. This alternative is illustrated in FIGS. 14 and 15. According to this alternative, processing proceeds as illustrated in FIGS. 1–3. The gold layer 26 may be formed by sputtering or by electroplating. However, the mask layer 30 is exposed and developed to leave the mask only over the certain bonding pads 20 where gold bonding pads are to be fabricated, as shown in FIG. 14.

Now, as illustrated in FIG. 15, the adhesion layer 24 and seed layer 26 are etched away where they are not covered by the mask layer 30. The mask layer 30 is removed. Gold bonding pads 26 have been formed above bonding pads 20. The thickness of the gold bonding pad 26 is, for example, 0.1 to 3 microns. The gold pad 26 is useful for wirebonding on top of aluminum bonding pads 20.

Figure 16:
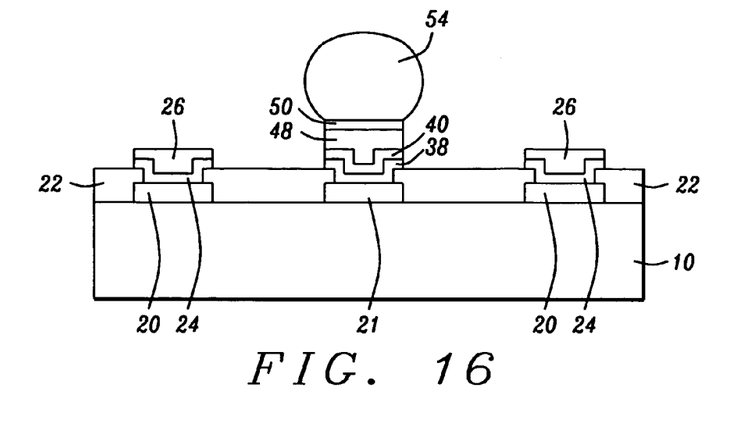

The solder bump 54 can now be fabricated as described above with reference to FIGS. 7–11. The solder bump 54 and gold bonding pads 26 are shown in FIG. 16. Now the wafer can be diced into chips as discussed above.

Figure 17:
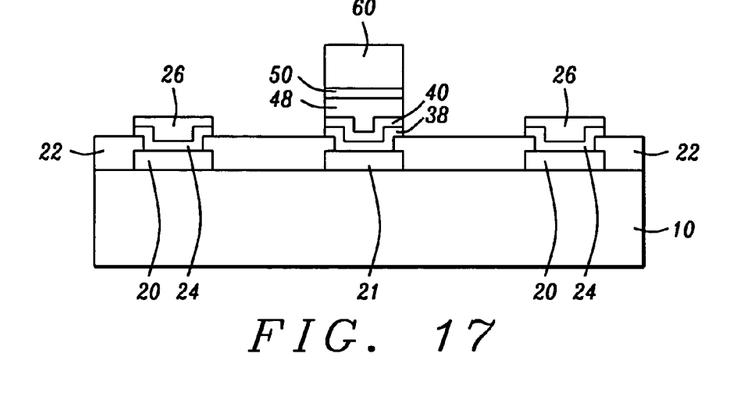
FIGS. 17 and 18 are cross-sectional representations showing further alternatives in the preferred embodiment of the present invention.

In a second alternative to the present invention, an unreflowed solder 60 can be formed on the solder bonding pad 38/40/48/50 rather than forming the reflowed solder bump 54. This alternative will be presented with reference to FIG. 17. Gold bumps or gold bonding pads 34 or 26 shown in FIG. 11 or 16 formed over the pads 20 as described above may be applied to the structure shown in FIG. 17, but only the gold bonding pad 26 is shown in FIG. 17. The solder bonding pad 38/40/48/50 pad is formed as described above. FIG. 17 shows adhesion layer 38, seed layer 40, UBM layer 48, and solder-wettable surface 50 composing the solder bonding pad. Now, an unreflowed solder 60 is formed on the solder bonding pad 38/40/48/50 as illustrated.

Figure 18:
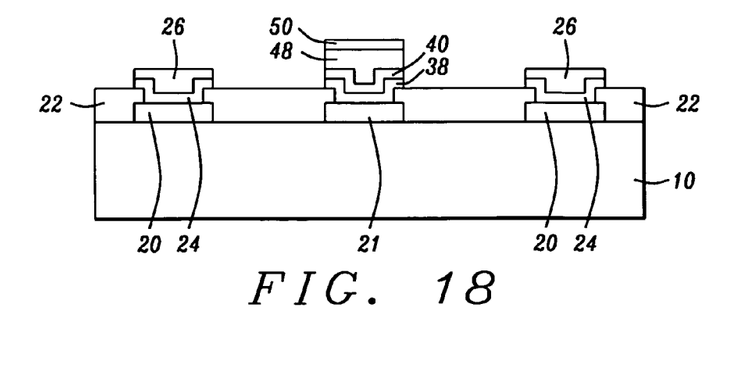

In another alternative illustrated in FIG. 18, the solder bonding pad 38/40/48/50 can be directly exposed without forming the above-mentioned solder bump 54 on it. A second integrated circuit that is to be bonded to this one may have the solder bump on it. Then, this bonding pad 38/40/48/50 will be free of solder materials. In another example, a solder ball may be placed on the chip at a later time in a solder mounting technique.

Figure 19:
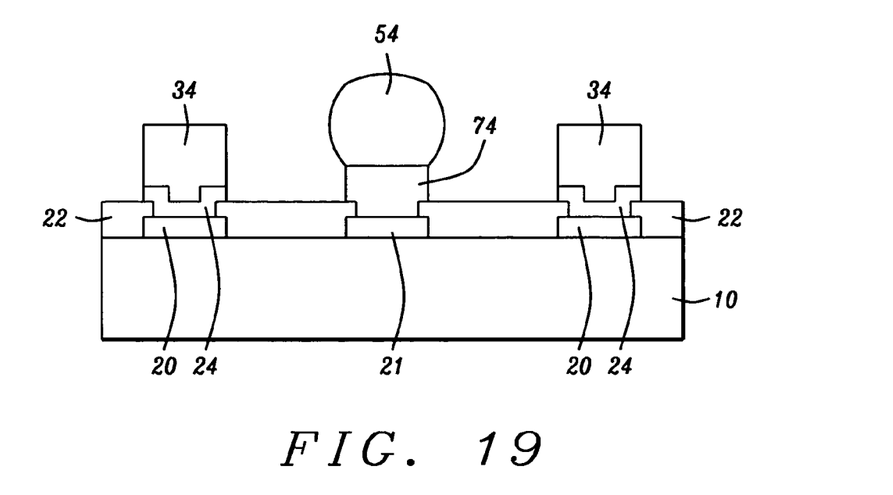
FIGS. 19 and 20 are cross-sectional representations of another alternative in the preferred embodiment of the present invention.
Figure 20:
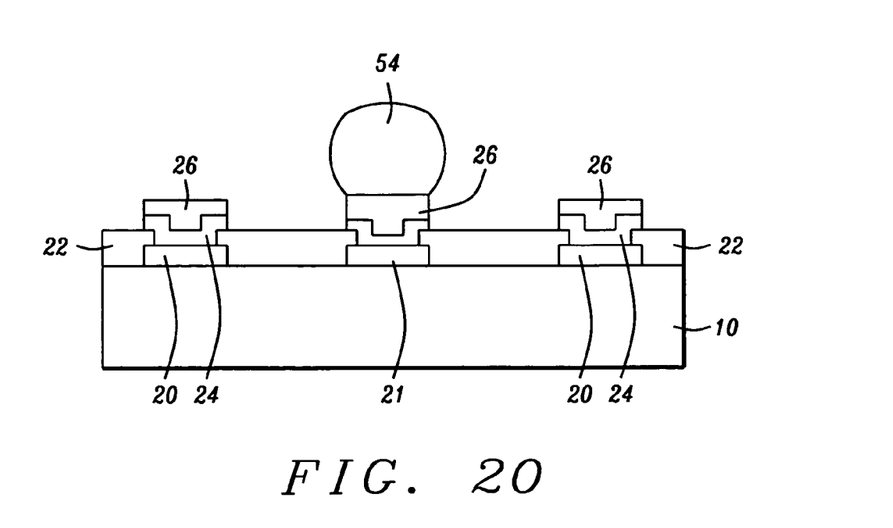

FIGS. 19 and 20 show a further alternative formation of the solder bump 54. Gold bumps 34 are illustrated in FIG. 19. After these gold bumps 34 are formed as described in FIG. 6, the solder bump 54 is to be formed. It will be understood that alternatively, gold bonding pads 26 formed as shown in FIG. 15 can be substituted for the gold bumps 34 shown in FIG. 19. Now, a solder bump 54 will be formed. A UBM layer 74 is sputter deposited onto the bonding pad 21. The bonding pad 21 may be an aluminum pad, for example, or it may be a copper pad formed by a damascene method, for example. Typically, a UBM layer 74 includes a solder wettable layer at its top surface. Then, the solder bump 54 is formed of solder as described above. In FIG. 20, gold pads 26 are shown. A solder ball 54 may be formed on the gold pad 26 as shown.

The present invention permits modification of the wafer required by the packaging process.

Figure 22:
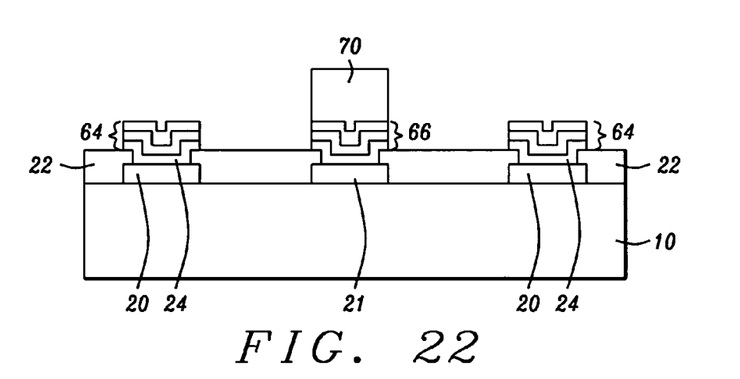
Figure 23:
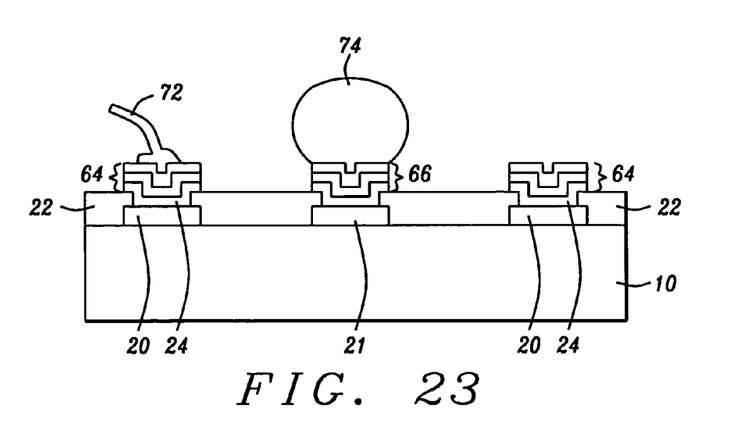

A second preferred embodiment of the present invention will be described with reference to FIGS. 21-23. This embodiment of the present invention integrates the material for the wire bonding pad and the solder bonding pad. That is, the material forming both the wire bonding pad 64 and the solder bonding pad 66 comprises the same stacked layer. For example, the layer stack includes an adhesion layer, for example, titanium or chromium or a chromium-copper alloy, formed on the pads 20 and 21 and a stacked metal layer, such as copper, nickel, and gold. The wire bonding pad 64 and the solder bonding pad 66 may include an adhesion layer/copper/ nickel/gold layer. The stacked layer can be used concurrently as a solder bonding or a wire bonding. The stacked layers can be sputter deposited in a blanket process and then patterned to form the bonding pads. For example, Ti or CrCu can be sputter deposited and Ni can be electroplated onto the wafer 10.

In certain applications of IC design, it is not necessary to decide ahead of time which wire bonding pad is for wire bonding and which solder bonding pad is for soldering. The lifetime and area of application of the IC are expanded in this embodiment of the invention. For example, if an IC is originally designed for wiring, but is not used due to changes in packaging, the use of this IC will not be limited if the IC comprises the dual functional bonding pad of the invention.

Figure 21:
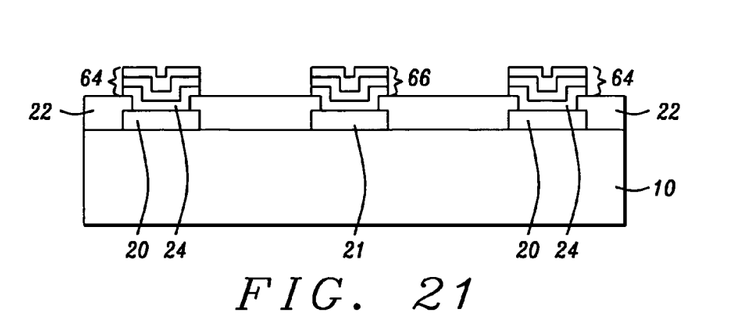
FIGS. 21 through 23 are cross-sectional representations of a second preferred embodiment of the present invention.

FIG. 21 illustrates wire bonding pad 64 and solder bonding pad 66 exposed on the wafer surface. As described above, wire bonding pad 64 and solder bonding pad 66 comprise the same stacked material layer. In FIG. 22, solder 70 that has not been reflowed is formed on solder bonding pad 66. In FIG. 23, bonding wire 72 has been formed on wire bonding pad 64 in a wire bonding process and reflowed solder bump 74 has been formed on solder bonding pad 66. It will be understood that any combination of wire bonds 72, solder bumps 74, or unreflowed solder 70 can be formed on the wafer 10.

The present invention has been described with respect to the structure and fabrication of a wafer. However, it will be understood by those skilled in the art that the invention is applicable to the wire bonding process or to the fabrication of solder conducted on a wafer structure to form a connection between the IC chip and an external circuit. The wire bonding pad and the solder pad are fabricated concurrently on the same wafer. Various chips on the wafer can be electrically connected with other chips, carriers, passive devices, and so on, through soldering or wire bonding. Furthermore, the gold bonding pads can be used as testing pads.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A circuit component comprising:
a wafer;
a first contact pad coupled to said wafer;
a second contact pad coupled to said wafer;
a passivation layer coupled to said wafer, wherein a first opening in said passivation layer is coupled to a first contact point of said first contact pad, and wherein a second opening in said passivation layer is coupled to a second contact point of said second contact pad, wherein said passivation layer comprises a nitride;
a metal bump coupled to said wafer, wherein said conductive interconnect is coupled to said first contact point through said first opening, wherein said metal bump comprises a titanium-containing layer coupled to said wafer, wherein said titanium-containing layer is coupled to said first contact point through said first opening, and a gold bump coupled to said titanium-containing layer, wherein said gold bump is coupled to said first contact point through said first opening, wherein said gold bump comprises a gold seed layer and an electroplated gold layer coupled to said gold seed layer without any conductive layer between said gold seed layer and said electroplated gold layer, wherein said gold bump has a height between 1 and 60 micrometers; and a solder wettable layer coupled to said wafer, wherein said solder wettable layer is coupled to said second contact point through said second opening, wherein said solder wettable layer comprises a gold-containing layer coupled to said wafer, wherein said gold-containing layer of said solder wettable layer is coupled to said second contact point through said second opening, wherein said gold-containing layer of said solder wettable layer has a thickness between 500 and 10,000 Angstroms.

2. The circuit component of claim 1, further comprising an electroplated copper layer coupled to said wafer, wherein said electroplated copper layer is coupled to said second contact point through said second opening, wherein said gold-containing layer of said solder wettable layer is further coupled to said electroplated copper layer, and said gold-containing layer of said solder wettable layer is coupled to said electroplated copper layer.

3. The circuit component of claim 1, wherein said gold bump is used to be wirebonded thereto.

4. The circuit component of claim 1, wherein said gold bump is used to be tape-automated bonded (TAB) thereto.

5. The circuit component of claim 1, wherein said gold seed layer of said gold bump comprises sputtered gold.

6. The circuit component of claim 1, wherein said titanium-containing layer comprises a titanium-tungsten alloy.

7. The circuit component of claim 1, wherein said titanium-containing layer comprises a-titanium nitride.

8. The circuit component of claim 1, wherein said gold bump, said gold seed layer and said titanium-containing layer are further coupled to said first contact point.

9. The circuit component of claim 1, wherein said gold-containing layer of said solder wettable layer is further coupled to said second contact point.

10. A circuit component comprising:
a wafer;
a first contact pad coupled to said wafer;
a second contact pad coupled to said wafer;
a passivation layer coupled to said wafer, wherein a first opening in said passivation layer is coupled to a first contact point of said first contact pad, and wherein a second opening in said passivation layer is coupled to a second contact point of said second contact pad, wherein said passivation layer comprises a nitride;
a gold bump comprising a gold seed layer physically coupled to said first contact point through said first opening, wherein said gold bump has a height thickness between 1 and 60 micrometers;
a copper seed layer directly physically coupled to said second contact point through said second opening;
an electroplated copper layer directly physically coupled on said copper seed layer; and
a solder wettable layer coupled to said electroplated copper layer, wherein said solder wettable layer comprises a gold-containing layer directly physically coupled to said electroplated copper layer, wherein said gold-containing layer has a thickness between 500 and 10,000 Angstroms and less than said thickness of said gold interconnect.

11. The circuit component of claim 10 further comprising a titanium-containing layer coupled to said wafer, wherein said titanium-containing layer is coupled to said second contact point through said second opening, wherein said copper seed layer, said electroplated copper layer and said solder wettable layer are further coupled to said titanium-containing layer.

12. The circuit component of claim 10, wherein said gold bump is used to be wirebonded thereto.

13. The circuit component of claim 10, wherein said gold bump is used to be ape-automated bonded (TAB) thereto.

14. The circuit component of claim 10, wherein said gold bump comprises sputtered gold.

15. The circuit component of claim 10, wherein said gold bump comprises electroplated gold.

16. The circuit component of claim 10 further comprising a titanium-tungsten-alloy layer coupled to said wafer, wherein said titanium-tungsten-alloy layer is coupled to said second contact point through said second opening, wherein said copper seed layer, said electroplated copper layer and said solder wettable layer are further coupled to said titanium-tungsten-alloy layer.

17. The circuit component of claim 10 further comprising a titanium-containing layer coupled to said wafer, wherein said titanium-containing layer is coupled to said first contact point through said first opening, wherein said gold interconnect is further coupled to said titanium-containing layer and is coupled to said titanium-containing layer.

18. The circuit component of claim 10, wherein said gold bump is further coupled to said first contact point.

19. The circuit component of claim 10, wherein said copper seed layer, said electroplated copper layer and said gold-containing layer of said solder wettable layer are further coupled to said second contact point.

20. A circuit component comprising:
a wafer;
a first contact pad coupled to said wafer;
a second contact pad coupled to said wafer;
a passivation layer coupled to said wafer, wherein a first opening in said passivation layer is coupled to a first contact point of said first contact pad, and wherein a second opening in said passivation layer is coupled to a second contact point of said second contact pad, wherein said passivation layer comprises a nitride;
a tape-automated-bonding (TAB) bump physically coupled to said first contact point through said first opening, wherein said tape-automated-bonding (TAB) bump comprises a first titanium-containing layer directly physically coupled to said first contact point through said first opening, and a gold interconnect coupled to said titanium-containing layer, wherein said gold bump comprises a gold seed layer and an electroplated gold layer directly physically coupled to said gold seed layer, wherein said gold bump has a height between 1 and 60 micrometers; and
a solder bonding pad directly physically coupled to said second contact point through said second opening, wherein said solder bonding pad comprises a gold-containing layer coupled to said wafer, wherein said gold-containing layer of said solder bonding pad is coupled to said second contact point through said second opening, wherein said gold-containing layer of said solder bonding pad has a thickness between 500 and 10,000 Angstroms.

21. The circuit component of claim 20, wherein said first titanium-containing layer comprises a titanium-tungsten alloy.

22. The circuit component of claim 20, wherein said first titanium-containing layer comprises a-titanium nitride.

23. The circuit component of claim 20, wherein said gold seed layer of said gold bump comprises sputtered gold.

24. The circuit component of claim 20, wherein said solder bonding pad further comprises an electroplated copper layer coupled to said wafer, wherein said electroplated copper layer is coupled to said second contact point through said second opening, wherein said gold-containing layer of said solder bonding pad is further coupled to said electroplated copper layer and is coupled to said electroplated copper layer.

25. The circuit component of claim 24, wherein said solder bonding pad further comprises a second titanium-containing layer coupled to said wafer, wherein said second titanium-containing layer is coupled to said second contact point through said second opening, wherein said electroplated copper layer and said gold-containing layer of said solder bonding pad are further coupled to said second titanium-containing layer and are coupled to said second titanium-containing layer.

26. The circuit component of claim 24, wherein said solder bonding pad further comprises a titanium-tungsten-alloy layer coupled to said wafer, wherein said titanium-tungsten-alloy layer is coupled to said second contact point through said second opening, wherein said electroplated copper layer and said gold-containing layer of said solder bonding pad are further coupled to said titanium-tungsten-alloy layer and are coupled to said titanium-tungsten-alloy-layer.

27. The circuit component of claim 20, wherein said solder bonding pad further comprises a copper/nickel layer coupled to said wafer, wherein said copper/nickel layer is coupled to said second contact point through said second opening, wherein said gold-containing layer of said solder bonding pad is further coupled to said copper/nickel layer and is coupled to said copper/nickel layer.

28. The circuit component of claim 27, wherein said solder bonding pad further comprises a second titanium-containing layer coupled to said wafer, wherein said second titanium-containing layer is coupled to said second contact point through said second opening, wherein said copper/nickel layer and said gold-containing layer of said solder bonding pad are further coupled to said second titanium-containing layer and are coupled to said second titanium-containing layer.

29. The circuit component of claim 28, wherein said second titanium-containing layer comprises a titanium-tungsten alloy.

30. The circuit component of claim 20, wherein said tape-automated-bonding (TAB) bump is further coupled to said first contact point.

31. The circuit component of claim 20, wherein said solder bonding pad is further coupled to said second contact point.

32. A circuit component comprising:
a wafer;
a first contact pad coupled to said wafer;
a second contact pad coupled to said wafer;
a passivation layer coupled to said wafer, wherein a first opening in said passivation layer is coupled to a first contact point of said first contact pad, and wherein a second opening in said passivation layer is coupled to a second contact point of said second contact pad, wherein said passivation layer comprises a nitride;
a tape-automated-bonding (TAB) bump directly physically coupled to said first contact point through said first opening, wherein said tape-automated-bonding (TAB) bump comprises a gold bump having a height between 1 and 60 micrometers; and
a solder bonding pad comprising an electroplated copper layer directly physically coupled to said second contact point through said second opening, and a gold-containing layer directly physically coupled to said electroplated copper layer, wherein said gold-containing layer has a thickness between 500 and 10,000 Angstroms.

33. The circuit component of claim 32, wherein said tape-automated-bonding (TAB) bump further comprises a titanium-containing layer coupled to said wafer, wherein said titanium-containing layer is coupled to said first contact point through said first opening, wherein said gold bump is further coupled to said titanium-containing layer and is coupled to said titanium-containing layer.

34. The circuit component of claim 32, wherein said tape-automated-bonding (TAB) bump further comprises a titanium-tungsten-alloy layer coupled to said wafer, wherein said titanium-tungsten-alloy layer is coupled to said first contact point through said first opening, wherein said gold bump is further coupled to said titanium-tungsten-alloy layer and is coupled to said titanium-tungsten-alloy layer.

35. The circuit component of claim 32, wherein said gold bump comprises sputtered gold.

36. The circuit component of claim 32, wherein said gold bump comprises electroplated gold.

37. The circuit component of claim 32, wherein said solder bonding pad further comprises a titanium-containing layer coupled to said wafer, wherein said titanium-containing layer is coupled to said second contact point through said second opening, wherein said gold-containing layer and said electroplated copper layer are further coupled to said titanium-containing layer and are coupled to said titanium-containing layer.

38. The circuit component of claim 32, wherein said solder bonding pad further comprises a titanium-tungsten-alloy layer coupled to said wafer, wherein said titanium-tungsten-alloy layer is coupled to said second contact point through said second opening, wherein said gold-containing layer and said electroplated copper layer are further coupled to said titanium-tungsten-alloy layer and are coupled to said titanium-tungsten-alloy layer.

39. The circuit component of claim 32, wherein said solder bonding pad further comprises a copper seed layer coupled to said wafer, wherein said copper seed layer is coupled to said second contact point through said second opening, wherein said electroplated copper layer is further directly on said copper seed layer and is coupled to said copper seed layer.

40. The circuit component of claim 32, wherein said solder bonding pad is further coupled to said second contact point.

41. The circuit component of claim 32, wherein said tape-automated-bonding (TAB) bump is further coupled to said first contact point.

42. The circuit component of claim 32, wherein said second contact pad is made of copper.

\* \* \* \* \*